United States Patent
Kim (10) Patent No.: US 11,434,566 B2
(45) Date of Patent: Sep. 6, 2022

(54) DEPOSITION APPARATUS CAPABLE OF APPLYING POWDER PARTICLES, AND METHOD FOR APPLYING POWDER PARTICLES

(71) Applicant: INDUSTRY FOUNDATION OF CHONNAM NATIONAL UNIVERSITY, Gwangju (KR)

(72) Inventor: Do Heyoung Kim, Seongnam-si (KR)

(73) Assignee: INDUSTRY FOUNDATION OF CHONNAM NATIONAL UNIVERSITY, Gwangju (KR)

(*) Notice: Subject to any disclaimer, the term of this patent is extended or adjusted under 35 U.S.C. 154(b) by 0 days.

(21) Appl. No.: 16/982,311

(22) PCT Filed: May 8, 2018

(86) PCT No.: PCT/KR2018/005254
§ 371 (c)(1),
(2) Date: Sep. 18, 2020

(87) PCT Pub. No.: WO2019/194347
PCT Pub. Date: Oct. 10, 2019

(65) Prior Publication Data
US 2021/0002764 A1    Jan. 7, 2021

(30) Foreign Application Priority Data
Apr. 3, 2018    (KR) .................. 10-2018-0038474

(51) Int. Cl.
C23C 16/455    (2006.01)
C23C 16/52    (2006.01)

(52) U.S. Cl.
CPC .. *C23C 16/45527* (2013.01); *C23C 16/45555* (2013.01); *C23C 16/52* (2013.01)

(58) Field of Classification Search
None
See application file for complete search history.

(56) References Cited

U.S. PATENT DOCUMENTS 4,699,805 A * 10/1987 Seelbach ............... C23C 16/455
                                                                  118/715

FOREIGN PATENT DOCUMENTS

DE          7402846 U         9/1977
JP         S49113779 A       10/1974
(Continued)

OTHER PUBLICATIONS

International Search Report of PCT/KR2018/005254, dated Jan. 22, 2019, English translation.
(Continued)

*Primary Examiner* — Shamim Ahmed
*Assistant Examiner* — Bradford M Gates
(74) *Attorney, Agent, or Firm* — STIP Law Group, LLC (57) ABSTRACT

An ALD or digital CVD apparatus and method for microparticles are proposed. The apparatus and the method use an impact, which is caused by the pulsed introduction of a precursor or a purging gas to be introduced into a reactor, without additional vibration or rotation of the reactor, so as to inhibit the agglomeration of particles to be applied to a surface and enable dispersion to be maximized, thereby enabling each particle to be uniformly applied, and simultaneously preventing the loss, in the reactor during processing, of powder to be coated without an additional separate filter or filler. A deposition reactor has a structure in which at least two overlapping reactors are provided. A reactant or a purging gas directly flows into an inner reactor in which a chemical reaction occurs. A purging step is simultaneously carried out in inner and outer reactors.

11 Claims, 8 Drawing Sheets

(56) References Cited

FOREIGN PATENT DOCUMENTS

| JP | S5613030 A | 2/1981 |
|----|------------|--------|
| JP | 2017514009 A | 6/2017 |
| KR | 1020140109234 A | 9/2014 |
| KR | 1020140128645 A | 11/2014 |
| KR | 1020160125982 A | 11/2016 |
| KR | 101696946 B1 | 1/2017 |
| WO | WO2010100235 A1 | 9/2010 |

OTHER PUBLICATIONS

The extended European search report of EP 18 91 3912, dated Nov. 12, 2021.

J. Ruud Van Ommen et al, Continuous production of nanostructured particles using spatial atomic layer deposition, Journal of Vacuum Science, Jan. 13, 2015, pp. 021513-021513-5, vol. 33, No. 2, American Institute of Physics, College Park, USA.

Delphine Longrie et al, Reactor concepts for atomic layer deposition on agitated particles; A review, Journal of Vacuum Science, pp. 010802-1-010802-13, vol. 32, No. 1, American Institute of Physics, College Park, USA.

\* cited by examiner

DEPOSITION APPARATUS CAPABLE OF APPLYING POWDER PARTICLES, AND METHOD FOR APPLYING POWDER PARTICLES

CROSS-REFERENCE TO RELATED APPLICATIONS

This application is the U.S. National Phase under 35 U.S.C. § 371 of International Application No. PCT/KR2018/005254 filed on May 8, 2018, which in turn claims the benefit of Korean Application No. 10-2018-0038474, filed on Apr. 3, 2018, the disclosures of which are incorporated by reference into the present application.

TECHNICAL FIELD

The present disclosure relates to an apparatus and a method able to apply a uniform thin-film to the surface of powder particles or microparticles and, more particularly, to an apparatus and method able to introduce a reactant in a time division manner (e.g. in a pulsed manner) to form a uniform thin-film on the surface of powder particles or microparticles, thereby fabricating a thin-film or a coating layer, the thickness of which is uniformly controlled, on the surface of microparticles by a chemical deposition method.

BACKGROUND ART

In general, a technology that causes a surface chemical reaction in chemical deposition is separately referred to as atomic layer deposition (ALD) or digital chemical vapor deposition (digital CVD).

Such a technology was developed in Finland in the early 1970s, and corresponds to digital CVD modified from typical chemical vapor deposition (CVD). In typical CVD, a solid material is synthesized by simultaneously blowing reactants into a reactor, whereas ALD is a technology that separates raw materials from each other, separately supplies the separated raw materials, and selectively allows a surface chemical reaction due to the adsorption of the raw materials to be used.

That is, gases of the raw materials are sequentially supplied to the interior of the reactor, and a purge process of removing the raw materials or by-products non-adsorbed to the surface of a substrate is added between the steps of introducing the reactants.

For example, in the case of fabricating an AB thin-film using a reaction: AX (reactant 1; gas)+BY (reactant 2; gas)→AB (product; solid) and XY (by-product; gas), the AX gas serving as reactant 1 is introduced into the reactor and the reactor is purged in the subsequent step, so that only the AX adsorbed to the surface of the substrate is present in the reactor.

When the BY gas serving as reactant 2 is introduced into the reactor in the subsequent step, the AX serving as reactant 1 adsorbed to the surface and the introduced BY serving as reactant 2 undergo a chemical reaction on the surface of the substrate, thereby generating the AB serving as the product on the surface of the substrate.

In the subsequent purge step, a non-reacted portion of the BY that has been introduced to the reactor and the XY (i.e. a bi-product) are discharged from the reactor. When the introduction of the AX or reactant 1, the purging, the introduction of the BY or reactant 2, and the purging are set to be one cycle, the thickness of a formed film may be controlled to the scale of nanometers on the basis of the number of repetitive cycles.

As described above, in the ALD process, the reaction occurs in a condition in which the introduced raw materials (i.e. precursors) are adsorbed to the surface, so that the thin-film grows due to a self-limiting reaction mechanism. Thus, excellent step coverage for the thin-film may be obtained and the number of processes may be adjusted, so that the thickness of the thin-film may be accurately adjusted at the nanometer level. In addition, a high-quality thin-film may be advantageously fabricated due to a sufficient reaction time.

However, a similar effect may be obtained using all adsorbates chemically and physically adsorbed to the surface without using reactants chemically adsorbed to the surface. Such a case may also be referred to as digital CVD.

Along with the opening of the nano era due to size reduction and rapid density growth of semiconductor devices since 2000, ALD has come to prominence as a nano thin-film deposition technology. At present, ALD is applied not only to the fabrication of thin-films necessary for the gates, isolation, bonding, and wiring of nano semiconductor devices, but also to the synthesize of various nano thin-film materials for energy storage and conversion devices, sensors, displays, and the like.

However, the application of such ALD or digital CVD is mainly used for a bulk substance (i.e. a continuous solid), such as a plate. An ALD or digital CVD solution able to form a uniform coating or deposition on the surface of powder particles is in a very early stage. It may be regarded that substantially no reactors for mass production have been commercially fabricated.

For the past 20 years, researchers have proposed several approaches for ALD or digital CVD reactors for microparticles. Such approaches may be generally divided into two types, namely a fluidization reactor (see FIG. 1) and a rotary reactor (see FIG. 2).

Figure 1:
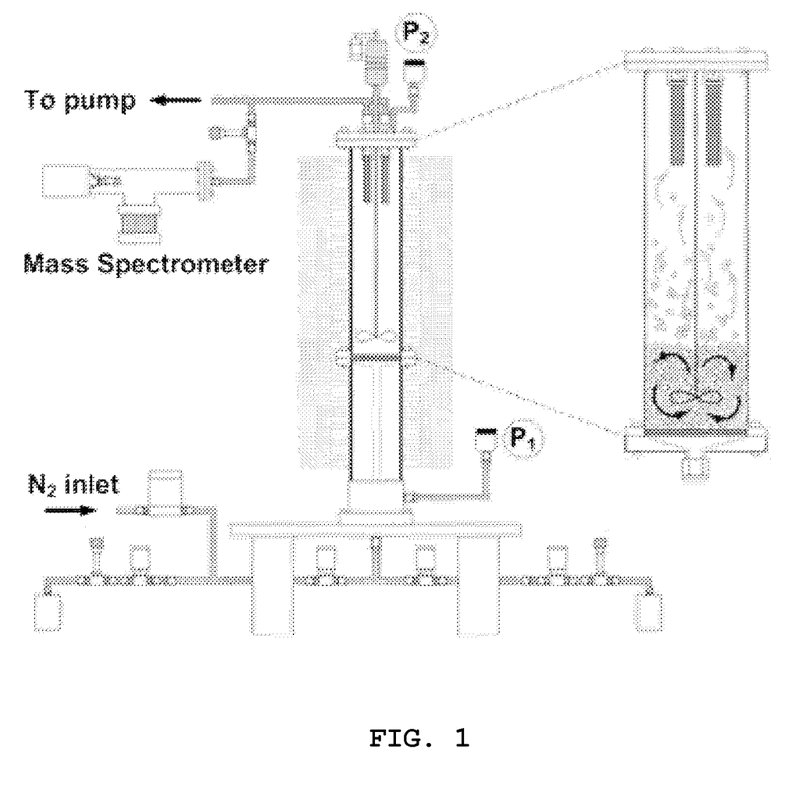
FIG. 1 is a conceptual diagram illustrating a fluidization ALD reactor according to the related art.
Figure 2:
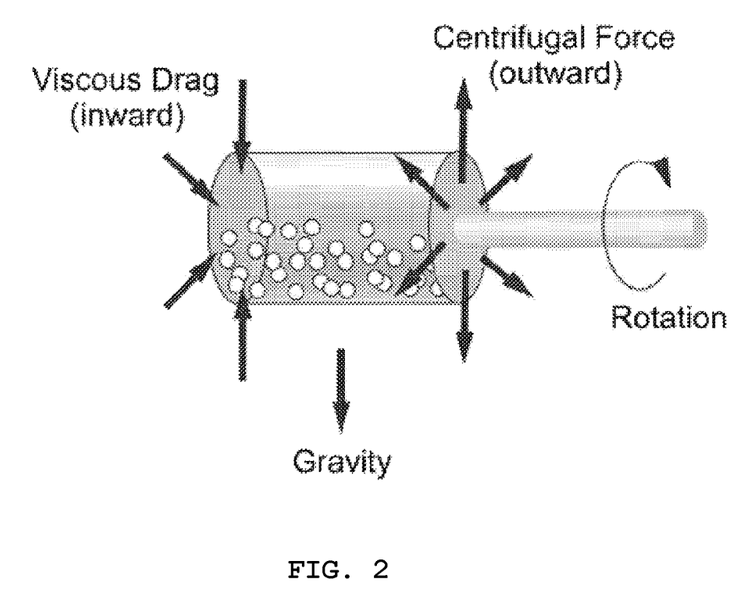
FIG. 2 is a conceptual diagram illustrating a rotary ALD reactor according to the related art.

For fundamental reasons why the different reactor types have been proposed, the tendency of agglomeration among powder particles is a natural characteristic, and methods of overcoming the agglomeration tendency are references by which the possibility of coating of each particle is determined. Therefore, previously-proposed ALD or digital CVD reactors for powder disclose specific methods able to minimize the agglomeration of powder particles, as illustrated in FIGS. 1 and 2.

However, the methods disclosed as above still have a variety of drawbacks. For example, in the ALD reactor using fluidization (see FIG. 1), it is almost impossible to obtain a fluidization condition enabled in the atmospheric pressure, due to the characteristics of ALD or digital CVD, the processing of which is carried out in a low temperature. In particular, fluidization is almost impossible for minute nano powder, since the formation of micro or nano channels is more prevalent than fluidization even in the atmospheric pressure condition.

The other reactor type or the rotary reactor (see FIG. 2) is configured such that rotation is performed using a shaft in the reactor and a dispersion effect is obtained using gravity and blades or mixing balls. However, it is difficult to obtain a sufficient degree of dispersion of powder using gravity and rotational force. In the same manner as in the fluidization reactor, there still exists the problem that there is no suitable solution to prevent powder loss in the reactor.

In most reactors proposed previously, a method of using a filter or filler having a nano or microstructure has been proposed to overcome the problem that the powder is lost from the reactor. However, the loss of a certain amount of powder is inevitable. In addition, frequent clogging of the filter or filler may be a significant obstacle to the reliable operation of equipment.

Therefore, in order to provide an ALD or digital CVD for microparticles that may be used practically, there is required a new method able to overcome the two issues, 1) the maximization of the degree of dispersion and 2) prevention of the problem that powder (i.e. microparticles) in the reactor is lost to the atmosphere from the reactor.

DISCLOSURE

Technical Problem

Accordingly, the present disclosure has been made keeping in mind the above problems occurring in the prior art, and an objective of the present disclosure is to provide an atomic layer deposition (ALD) or digital chemical vapor deposition (digital CVD) apparatus and method for microparticles, the apparatus and method having a novel concept and being able to reduce the agglomeration of powder particles without vibration or rotation, thereby enabling individual particles to be coated uniformly and preventing powder to be coated from leaking from a reactor during processing.

Also provided are an apparatus and a method able to disperse carrier particles to be coated in a simple manner without additional vibrating or rotating equipment in an ALD or digital CVD process for coating microparticles and to prevent powder to be coated from leaking from the reactor during processing.

Technical Solution

According to an embodiment of the present disclosure, a deposition apparatus includes: an outer reactor 1 including an openable and closable door 10; and an inner reactor 2 fixedly loaded into the outer reactor 1 through the door 10, wherein a volume 11 of the outer reactor 1 and a volume 12 of the inner reactor 2 are spatially divided by the inner reactor 2, the inner reactor 2 has a spiral structure or a twisted configuration in which a middle area between opposite end portions thereof is twisted, connectors 3, 4 are provided on the opposite end of the inner reactor 2 to be connected to feed lines 7, 8, along which a precursor serving as a reactant or a purge gas is loaded from outside the outer reactor 1 into the inner reactor 2 in a time division manner, and the connectors 3, 4 of the inner reactor 2 have a greater cross-sectional area than the feed lines 7, 8.

The precursor serving as a reactant or the purge gas may be supplied from outside the deposition apparatus along the feed lines 7, 8 in a pulsed manner so as to move particles loaded into the inner reactor 2 from one side A to the other side B. A non-reacted portion of a reactant or the purge gas residing in the inner reactor 2 may be discharged from the deposition apparatus through a space C present due to a difference in the cross-sectional area between the connectors 3, 4 and the feed lines 7, 8.

An ALD or digital CVD reaction may be performed on surfaces of particles loaded into the inner reactor 2 through the precursor serving as a reactant and the purge gas loaded into the inner reactor 2 in a time division manner. Here, the precursor serving as a reactant and the purge gas loaded into the inner reactor 2 in a time division manner may be supplied in a pulsed manner, thereby moving and dispersing agglomerated particles.

The feed lines 7, 8 communicating with the connectors 3, 4 located on the opposite ends of the inner reactor 2 may be one or more feed lines. The deposition apparatus may further include a heater able to heat an entirety or a portion of the inner reactor 2 or the outer reactor 1 to enable the ALD or digital CVD reaction.

According to another embodiment of the present disclosure, a method of uniformly coating surfaces of particles includes: a step of preparing the above-described deposition apparatus; a step of loading particles into the inner reactor 2; a fixing step of connecting the connectors 3, 4 of the inner reactor 2 to the feed lines 7, 8 by loading the inner reactor 2 through the door 10 of outer reactor 1; a first adsorption step of adsorbing a first precursor serving as a reactant to surfaces of the particles by supplying the first precursor to one side of the inner reactor 2 along the feed line in a pulsed manner; a first purge step of discharging a non-reacted portion of the first precursor from the inner reactor 2 by supplying a purge gas to one side of the inner reactor 2 in a pulsed manner after the first adsorption step; a second adsorption step of adsorbing a second precursor serving as a reactant to the surfaces of the particles by supplying the second precursor to the other side of the inner reactor 2 along the feed line in a pulsed manner; a second purge step of discharging a non-reacted portion of the second precursor from the inner reactor 2 by supplying the purge gas to the other side of the inner reactor 2 in a pulsed manner after the second adsorption step; and a surface reaction step of causing a surface reaction on the particles by increasing the temperature of at least one of the outer reactor 1 and the inner reactor 2.

At least one of the first adsorption step and the second adsorption step may be repeatedly performed at least a plurality of times. At least one of the first purge step and the second purge step may be repeatedly performed at least a plurality of times.

In the first and second adsorption steps or the first and second purge steps, the particles may be moved in the inner reactor 2 in response to the first and second precursors or the purge gas being supplied in a pulsed manner, so that the agglomerated particles are dispersed.

In addition, in the first purge step or the second purge step, the non-reacted portion discharged from the inner reactor 2 may be discharged from the deposition apparatus through the feed line 7 or 8. Simultaneously with the discharging through the feed line 7 or 8, the non-reacted portion or the purge gas residing in the inner reactor 2 may be discharged from the deposition apparatus through an outlet 9 of the outer reactor communicating with the outer reactor 1, due to a space C present due to a difference in the cross-sectional area between the connectors 3, 4 and the feed lines 7, 8.

The first adsorption step, the first purge step, the second adsorption step, and the second purge step may be repeatedly performed at least once.

Advantageous Effects

According to the present disclosure, due to the use of the double wall reactor structure, powder to be coated may be dispersed within the internal reactor by the force of a reactant or a purge gas introduced in the form of a pulse. Since the purge process is performed by the external reactor, it may be possible to prevent the powder from being discharged from the ALD or digital CVD reactor or being lost to a vacuum pump (in a low pressure process) or to the atmosphere (in an atmospheric pressure process) without using a filter or a filler in the reactor.

In addition, since the powder to be coated is physically moved in the inner reactor by the force of the reactant or the purge gas introduced in the form of a pulse, an effect that the surface of the powder may be uniformly coated with the reactant may be provided in addition to the dispersion effect.

DESCRIPTION OF THE REFERENCE NUMERALS IN THE DRAWINGS

1: outer reactor
2: inner reactor
3, 4: indirect connector
7,8: precursor or purge gas feed line
9: outlet of outer reactor
10: door of outer reactor
11: volume of outer reactor
12: volume of inner reactor
13: pump
14: powder particles loaded to inter reactor
A, B: areas of inter reactor
C: space

MODE FOR INVENTION

Hereinafter, example embodiments of the present disclosure will be described in detail with reference to the accompanying drawings. Prior to the detailed description, terms and words used in the specification and the appended claims should be interpreted as having a meaning that is consistent with the technical idea of the present disclosure and should not be interpreted as being limited to ordinary or dictionary meanings.

Throughout the specification, when it is mentioned that a member is described as being located "above" or "on" another member, it should be interpreted that, not only may the member be in contact with the other member, but a further member may also be present between the two members. It will also be understood that the terms "comprise", "include", "have", and any variations thereof used herein are intended to cover non-exclusive inclusions unless explicitly described to the contrary.

In addition, terms, such as "first" or "second", may be used to distinguish one element from the other element, but it should not be understood that the scope of protection is limited by these terms. For example, a first element may be referred to as a second element, and the second element may similarly be referred to as the first element.

Reference numerals may be used herein to indicate steps. It should be understood, however, that such reference numerals are merely used for the sake of brevity but do not limit the order of the steps. The order of the steps may vary from the order rendered in the specification, unless explicitly described to the contrary in the context. That is, the steps may take place in the same order as rendered in the specification, may be performed substantially simultaneously, or may be performed in a reverse order from the order rendered in the specification.

In addition, the drawings accompanied in the specification are provided to illustrate the example embodiments of the present disclosure in order to more fully convey the technical idea of the present disclosure. The present disclosure should not be construed as being limited to these embodiments illustrated in the drawings.

The present disclosure proposes a double wall reactor structure including an outer reactor 1 and an inner reactor 2 in order to solve and realize the technical problem and the advantageous effects as described above. More specifically, a deposition apparatus according to the present disclosure may include the inner reactor 2 into which precursors are introduced and in which an ALD or digital CVD process is mainly performed and the outer reactor 1 configured to prevent powder from leaking from a deposition reactor during processing in order to solve the problems of the related art.

Described in more detail, the present disclosure provides an atomic layer deposition (ALD) or digital chemical vapor deposition (digital CVD) apparatus and method for microparticles, the apparatus and method being able to reduce the agglomeration of particles to be surface-coated and maximize the dispersion of the particles using impacts obtained by applying pulses to a precursor or a purge gas loaded to the deposition reactor without additional vibration or rotation of the reactors, to provide the microparticles to be uniformly coated, and to prevent powder supposed to form a coating layer from being lost in the reactors during processing without an additional filter or filler.

The deposition reactor according to the present disclosure has the double wall reactor structure in which two or more reactors (e.g. the outer reactor and the inner reactor) are arranged in an overlapping manner. While reactants or a purge gas are directly introduced into the inner reactor where a chemical reaction takes place, a purge step may be simultaneously performed in both the inner reactor and the outer reactor.

The inner reactor 2 of the deposition reactor according to the present disclosure performs an ALD or digital CVD process. In the inner reactor 2, the dispersion of particles is effectively performed using force or pressure generated during the introduction of the precursor and the introduction of the purge gas. Since the purging is performed using the outer reactor 1, the loss of the powder supposed to form the coating layer may be reduced without the filter or the filler.

In addition, in order to maximize the dispersion effect of powder particles located within the inner reactor 2, a device (e.g. an ultrasonic wave generating unit, a magnetic field generating unit, or an electric field generating unit) able to apply additional physical force to the deposition reactor having the double wall reactor structure according to the present disclosure may be further provided.

Hereinafter, embodiments of the present disclosure will be described in detail with reference to the accompanying drawings. However, the present disclosure should not be construed as being limited to the embodiments set forth herein and may be embodied in a variety of different forms. In the following description of the present disclosure, a detailed description of known functions and configurations will be omitted in the situation in which the subject matter of the present disclosure may be rendered unnecessarily unclear thereby.

In addition, it should be interpreted that some components or steps described herein may not be included or additional components or steps may be further included.

Figure 3:
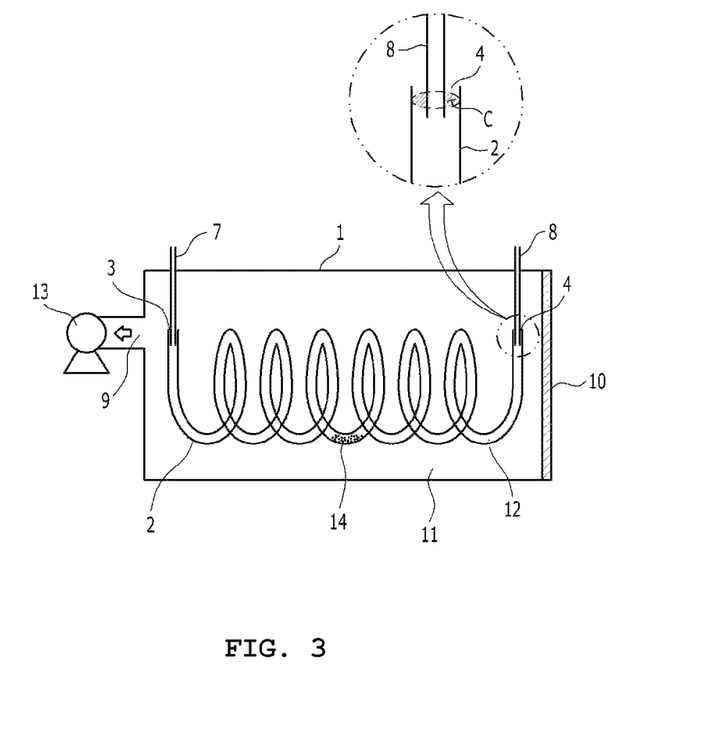
FIG. 3 is a conceptual diagram illustrating an ALD or digital CVD double reactor according to the present disclosure.

FIG. 3 illustrates an overall configuration of a powder coating ALD or digital CVD reactor apparatus according to the present disclosure. Although the double wall reactor is illustrated as an example in the present embodiment, the present disclosure may be applied to a triple wall reactor structure or a multi-wall reactor structure (i.e. a reactor structure having more walls).

As illustrated in FIG. 3, the apparatus according to the present disclosure has the double wall reactor structure in which the inner reactor 2 where a powder coating ALD or digital CVD reaction is performed is located inside the outer reactor 1.

The outer reactor 1 includes an inlet through which the precursor or the purge gas is loaded, an outlet 9 through which the purge gas, non-reacted portions of the reactants, by-products, and the like are discharged, and an outer reactor door 10.

The inner reactor 2 may have a spiral structure or a variety of twisted structures able to capture the movement of powder particles to be surface-coated in the space within the reactor. More particularly, the inner reactor 2 may have a twisted structure in which a middle area between both ends has a curvature. In addition, a variety of other structures having a curvature may be used.

The inner reactor 2 and the outer reactor 1 may be separated with a space being disposed therebetween. The inner reactor 2 may be easily fitted into and easily detached from the outer reactor 1 through the door 10 of the outer reactor 1.

The powder to be surface-coated is loaded into the inner reactor 2, more particularly, to the central area of the inner reactor 2 before the inner reactor 2 is fitted into the outer reactor 1. After the inner reactor is detached from the outer reactor after the ALD or digital CVD reaction is completed, the powder may be discharged from inside the inner reactor. Accordingly, the loading of the reactant particles or powder may be facilitated, and the recovery of the coated particles or powder may be facilitated.

As illustrated in FIG. 3, the precursor or the purge gas may be directly introduced into the inner reactor 2 from outside the deposition apparatus along feed lines 7 and 8 directly connected to indirect connectors 3 and 4 of the inner reactor 2.

In addition, after the ALD or digital CVD reaction has been performed on the surface of the previously loaded particles or powder in the inner reactor 2, residual non-reacted portions of the reactants, by-products, and the like may be discharged through the indirect connectors 3 and 4 located on both ends of the inner reactor 2. Since the cross-sectional area of the indirect connectors 3 and 4 is greater than the cross-sectional area of the feed lines 7 and 8, the non-reacted portions of the reactants, the by-products, and the like may be discharged into the outer reactor through spaces C present between the cross-sections of the indirect connectors 3 and 4 and the cross-sections of the feed lines 7 and 8.

Afterwards, the non-reacted portions of the reactants, the by-products, and the like may selectively be discharged from the deposition apparatus through the outlet 9. The non-reacted portions of the reactant precursor or the particles or powder to be surface-coated may be recovered again to the interior of the outer reactor so as to be reused.

As another embodiment, the precursor or the purge gas introduced into the inner reactor 2 may be purged (or discharged) through the indirect connectors 3 and 4 indirectly connecting the inner reactor 2 and the outer reactor 1 via the spaces C. At the same time, all of the precursor and the purge gas may be discharged through the outlet 9 of the outer reactor 1.

For example, an AB thin-film may be fabricated on the surface of particles or powder using a reaction: AX (reactant; gas)+BY (reactant; gas)→AB (product; solid) and XY (by-product; gas).

In this case, after the AX reactant is introduced into the inner reactor, the inner reactor may be purged by loading a purge gas into the inner reactor, so that only the AX reactant adsorbed to the surface of the particles is present in the inner reactor.

In the subsequent step, the BY reactant is introduced into the inner reactor in the same manner as in the previous step for the AX, the AX reactant adsorbed to the surface of a substrate and the introduced BY perform a chemical reaction on the surface of the substrate, thereby forming an AB coating layer as a product on the surface of the particles.

Finally, the purge step is performed again to discharge a portion of the BY that has not reacted and the by-product XY of the reaction from the inner reactor. Here, the BX may include an activation reactant, such as plasma or ozone.

This process may be performed in the deposition apparatus according to the present disclosure illustrated in FIG. 3. Described in detail, the particles or powder 14 is loaded to one side (i.e. area A or B) or a middle portion (see FIG. 4). Afterwards, the inner reactor 2 is loaded into the outer reactor 1 through the outer reactor door 10 and is fixed.

Figure 4:
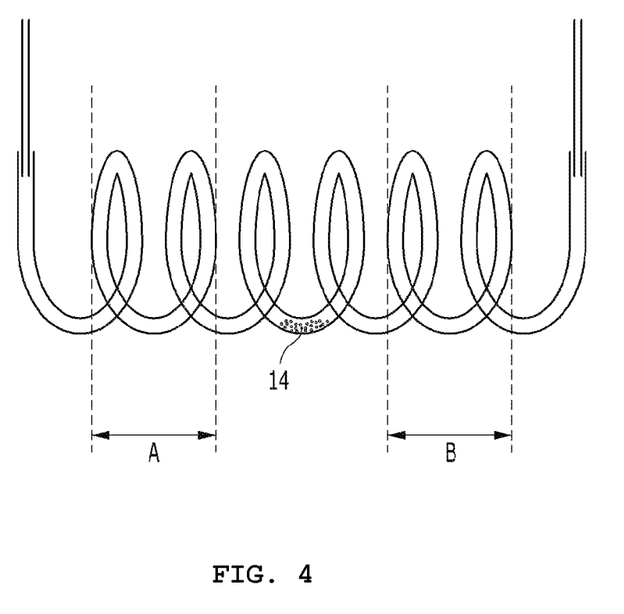
FIG. 4 is a diagram illustrating a situation in which microparticles to be coated are loaded into the internal reactor of the ALD or digital CVD double reactor according to the present disclosure.

Here, the indirect connectors 3 and 4 of the inner reactor 2 are fixedly connected to the feed lines 7 and 8 extending through the outer reactor 1, and the outer reactor 1 is hermetically sealed by closing the door 11.

Afterwards, the AX reactant is introduced into the inner reactor along the feed line 7 or 8. The AX reactant is introduced into the inner reactor 2 along the feed line 8 through the indirect connector 4 located on one side of the inner reactor (i.e. a right portion in FIG. 5). Particularly, the AX reactant may be introduced in the form of a pulse.

Figure 5:
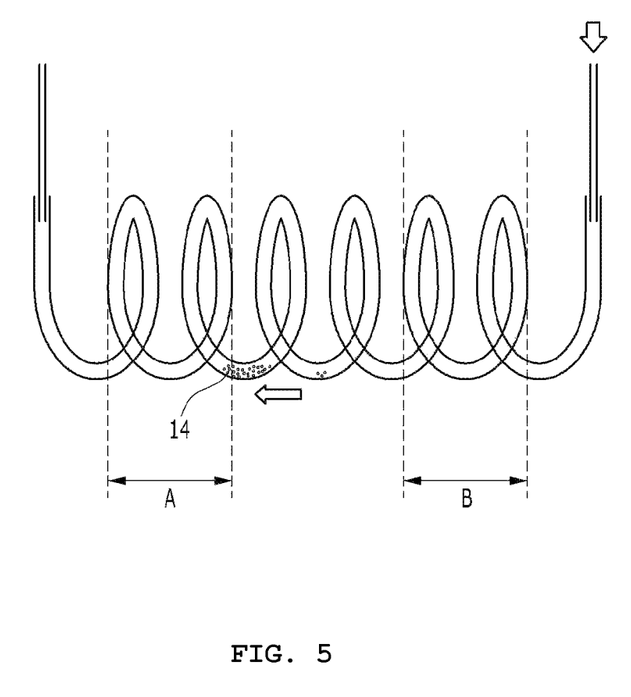
FIG. 5 and FIG. 6 are diagrams illustrating a situation in which the microparticles are moved from the right to the left in the internal reactor, in response to a precursor (FIG. 5) or a purge gas (FIG. 6) being introduced along a right feed line of the internal reactor.

Since the precursor AX is supplied as a pulse on a carrier gas, the powder particles that have been previously loaded to the middle portion of the inner reactor are moved to the area A opposite to the portion to which the precursor AX is supplied, and at the same time, the particles are dispersed and disagglomerate (see FIG. 5).

Afterwards, the purge gas may be loaded in the same direction in which the precursor AX is loaded. Through this purge process, the powder particles loaded in the inner reactor may be further moved and the dispersion effects may be further increased (see FIG. 6).

Figure 6:
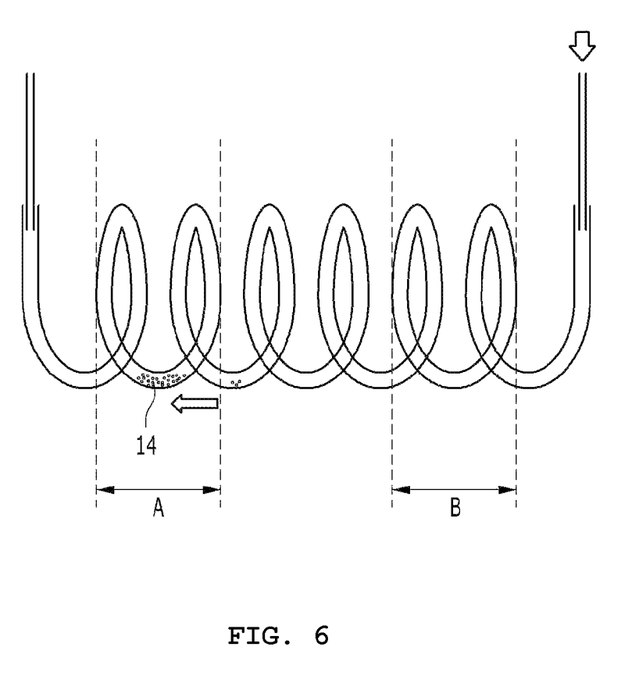

In addition, the introduction of the purge gas as described above may be performed in a direction opposite to the direction illustrated in FIG. 6 (i.e. the direction in which the precursor AX is loaded). When the purge gas is introduced in the opposite direction, the powder particles (that have been moved toward the area A by the pulse of the precursor AX loaded) are moved again to the area B in the inner reactor 2. The effect of the dispersion may be further increased with increases in the distance of the movement.

The loading of the precursor AX serving as the reactant and the purge gas may be performed one time but may be performed a plurality of times.

In addition, the efficiency of the purging may be further increased by applying a vacuum using a pump 13 connected to the outer reactor 1 during or after the purge process.

Figure 7:
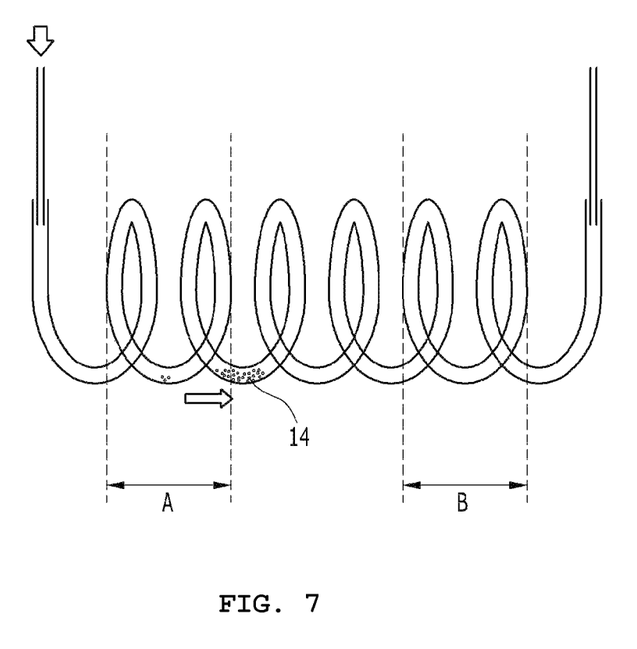
FIG. 7 and FIG. 8 are diagrams illustrating a situation in which the microparticles are moved from the left to the right in the internal reactor, in response to a precursor (FIG. 7) or a purge gas (FIG. 8) being introduced along a left feed line of the internal reactor.
Figure 8:
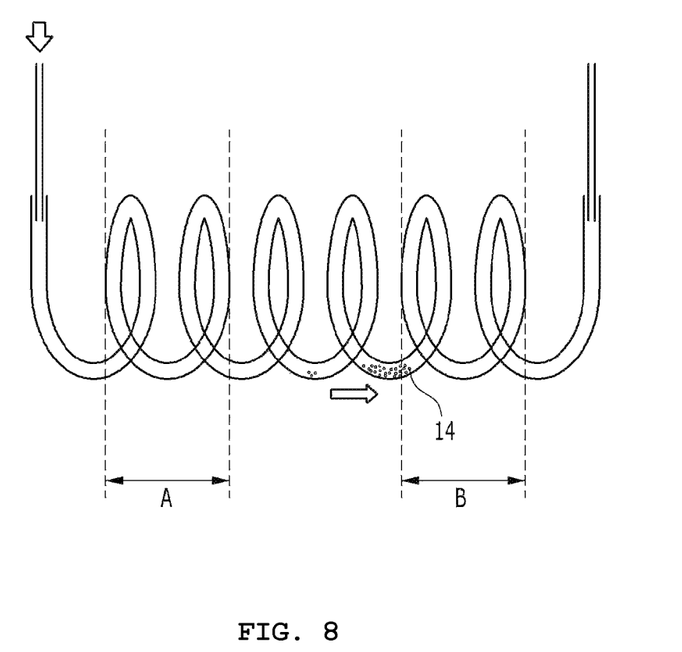

After the purge process with the precursor AX serving as the reactant, as illustrated in FIGS. 5 and 6, the powder particles, with the precursor AX adsorbed to the surface thereof, are moved to the area A of the inner reactor. Afterwards, as illustrated in FIGS. 7 and 8, the powder particles may be moved toward the area B by sequentially blowing the precursor BY and the purge gas to an opposite area in the inner reactor 2 in a pulsed manner.

That is, the BY precursor serving as the reactant is loaded in a pulsed manner through the indirect connector and along the feed line located on the side (opposite to the side in which the AX is loaded) of the inner reactor 2, the powder particles are moved again toward the area B through the middle area of the inner reactor 2. During this process, the disagglomeration and the dispersion of the powder particles described above are performed so that the surface reaction of the powder particles is performed.

Thus, the movement and the surface reaction of the powder simultaneously occur, so that a more uniform coating layer may be formed on the surface of the powder or the particles.

Afterwards, the purge step may be performed in the same direction in which the BY precursor is loaded or in the opposite direction as required. The direction in which the purge gas is loaded may be suitably selected in consideration of the positions of the powder particles in the inner reactor.

Selectively, the purge step may be performed in one direction of the direction in which the AX reactant is loaded and the direction in which the BY reactant is loaded. The purge step may be performed using a pump connected to the outer reactor, instead of using the purge gas.

The purge process using the pump outside the reactor is possible since the inner reactor is not completely seated due to the difference in the cross-sectional area between the indirect connectors and the feed lines of the inner reactor and the spaces C are present between the indirect connectors and the feed lines. The purge process using the external pump or the purge process enabled by the loading of the purge gas along the feed lines may be performed simultaneously or sequentially, or only one of the purge processes may be performed as required.

One or more feed lines may be located on the indirect connectors provided on both ends of the inner reactor, but the number of the feed lines may be properly adjusted such that at least the spaces C are present.

Since the movement and disagglomeration of the powder particles may be enabled by loading the precursor (AX, BY, or the like) serving as the reactant and the purge gas simultaneously with performing the ALD or digital CVD reaction on the surface of the particles loaded to the inner reactor 2 using the precursor (AX, BY, or the like) serving as the reactant and the purge gas loaded to the inner reactor 2 in a time division manner as described above, the surface reaction and the surface coating of the particles may be performed more uniformly.

The above-described examples may be variously modified. For example, the precursors AX and BY serving as the reactants may be supplied along the feed lines 7 and 8, respectively, and the purge process may be performed through the outlet 9 of the outer reactor 1 without the supply of the purge gas. The supply of the precursors AX and BY may also be performed together with the purge process of supplying the purge gas along the feed lines 7 and 8.

In addition, a single one of the feed lines 7 and 8 may be present in each of the indirect connectors 3 and 4, but a plurality of feed lines may be present in each of the indirect connectors 3 and 4. It may be possible to cause the surface reaction by moving the powder particles a plurality of times from one side (i.e. area A) to the other side (i.e. area B) of the inner reactor In addition, the blowing of the precursor material and the purge gas are performed in a pulsed manner. Here, the powder loaded into the inner reactor 2 through the pulsed blowing in the opposite direction may be coated by the particle surface reaction while moving in a dispersing manner while reciprocally moving a plurality of times from the area A to the area B and vice versa in the inner reactor 2. In this regard, the pulsed blowing of the reactants and the purge gas may be suitably performed by manipulating valves connected to the feed lines to be opened or closed. The supply flow rate at this time may also be controlled using a flow controller, in consideration of the size of a reservoir in the inner reactor 2.

A different precursor material reacting with the precursor material AX may be used or, in the case of the corresponding reactant BY, a reactant activated with plasma or ozone may be used. When heating for the ALD or digital CVD method is required, a heater mounted inside or outside the outer reactor 1 may be used.

In addition, the plasma may be generated within the inner reactor 1 or the entire deposition reactor.

A surface coating method for powder particles according to the present disclosure will be described as an example. As illustrated in FIG. 5, the powder loaded to the inner reactor 2 is dispersed while being moved toward the area A in response to the precursor AX being introduced in a pulsed manner. When the purge gas is introduced in the subsequent step, the powder is moved while being dispersed as illustrated in FIG. 6.

Afterwards, an additional purge step is performed using the pump connected to the outer reactor 1. As illustrated in FIG. 7, a corresponding reactant or the other precursor BY is introduced in a pulsed manner along the opposite feed line in the inner reactor. The purge gas is introduced in a pulsed manner through the same inlet, so that the microparticles are moved toward the area B while being dispersed.

Here, selectively, the respective purge gases may be supplied in the opposite direction to the reactant instead of being supplied in the same direction as the reactant. After the purge gases are loaded, an additional purge step may be performed using the pump connected to the outer reactor.

Through the above-described process, a single cycle of the ALD or digital CVD according to the present disclosure is performed. When the above-described process is repeated a plurality of times, the movement of the powder may be continuously caused to prevent the agglomeration, so that the thin-film coating layer may be fabricated more uniformly on the particles.

In addition, as described above, feed lines for the supply of the purge gas and feed lines for the supply of the precursor may be separately provided as required, or a plurality of purge lines may be provided to supply the purge gas in a pulsed manner. Accordingly, the dispersion effect of the microparticles may be maximized.

In addition, a reactor according to some embodiments of the present disclosure may be configured such that a specific precursor or a specific purge gas is repeatedly introduced or the number of introduction lines of the purge gas is increased so that the particles may be more effectively carried and dispersed. In addition, a deposition reactor according to some embodiments may have a reactor structure comprised of three or more inner and outer reactors, instead of being comprised of the two reactors, differently from the foregoing embodiment.

As set forth above, the apparatus and the method for ALD or digital CVD deposition for powder coating are not limited the above-described configuration and method according to the foregoing embodiments. The entirety or some of the embodiments may be selectively combined in order to enable a variety or modifications to the foregoing embodiments. That is, the technical ideal of the present disclosure is not limited thereto.

INDUSTRIAL APPLICABILITY

The present disclosure is intended to provide the ALD or digital CVD apparatus and method for microparticles, the apparatus and method having a novel concept and being able to reduce the agglomeration powder particles without vibration or rotation, thereby enabling individual particles to be coated uniformly and preventing powder to be coated from leaking from a reactor during processing. Since the double wall reactor structure is used, powder to be coated may be dispersed within the internal reactor by the force of a reactant or a purge gas introduced in the form of a pulse. Since the purge process is performed by the external reactor, it may be possible to prevent the powder from being discharged from the ALD or digital CVD reactor from being lost to a vacuum pump (in a low pressure process) or to the atmosphere (in an atmospheric pressure process) without using a filter or a filler in the reactor. Therefore, the present disclosure is regarded as having industrial applicability.

The invention claimed is:

1. A deposition apparatus comprising:
an outer reactor (1) including an openable and closable door (10); and
an inner reactor (2) fixedly loaded into the outer reactor (1) through the door (10),
wherein a volume (11) of the outer reactor (1) and a volume (12) of the inner reactor (2) are spatially divided by the inner reactor (2),
the inner reactor (2) has a spiral structure,
connectors (3, 4) are provided on the opposite end portions of the inner reactor (2) to be connected to feed lines (7, 8), along which a precursor serving as a reactant or a purge gas is loaded from outside the outer reactor (1) into the inner reactor (2) in a time division manner,
the connectors (3, 4) of the inner reactor (2) have a greater cross-sectional area than the feed lines (7, 8), and
a non-reacted portion of a reactant or the purge gas residing in the inner reactor (2) is discharged through a space (C) present due to a difference in the cross-sectional area between the connectors (3, 4) and the feed lines (7, 8) and is discharged from the deposition apparatus through the outer reactor.

2. The deposition apparatus of claim 1, wherein the precursor serving as a reactant or the purge gas is supplied from outside the deposition apparatus along the feed lines (7, 8) in a pulsed manner so as to move particles loaded into the inner reactor (2) from a first opposite end portion to a second opposite end portion.

3. The deposition apparatus of claim 1, wherein an atomic layer deposition or digital chemical vapor deposition reaction is performed on surfaces of particles loaded into the inner reactor (2) through the precursor serving as a reactant and the purge gas loaded into the inner reactor (2) in a time division manner.

4. The deposition apparatus of claim 3, wherein the precursor serving as a reactant and the purge gas loaded into the inner reactor (2) in a time division manner are supplied in a pulsed manner, thereby moving and dispersing agglomerated particles.

5. The deposition apparatus of claim 1, wherein the feed lines (7, 8) communicating with the connectors (3, 4) located on the opposite end portions of the inner reactor (2) comprise one or more feed lines.

6. The deposition apparatus of claim 3, further comprising a heater able to heat an entirety or a portion of the inner reactor (2) or the outer reactor (1) to enable the atomic layer deposition or digital chemical vapor deposition reaction.

7. A method of uniformly coating surfaces of particles, the method comprising:
a step of preparing the deposition apparatus as claimed in claim 1;
a step of loading particles into the inner reactor (2);
a fixing step of connecting the connectors (3, 4) of the inner reactor (2) to the feed lines (7, 8) by loading the inner reactor (2) through the door (10) of outer reactor (1);
a first adsorption step of adsorbing a first precursor serving as a reactant to surfaces of the particles by supplying the first precursor to one side of the inner reactor (2) along the feed line in a pulsed manner;
a first purge step of discharging a non-reacted portion of the first precursor to the outer reactor (1) outside the inner reactor (2) or from the deposition apparatus through the outer reactor (1) by supplying a purge gas to one side of the inner reactor (2) in a pulsed manner after the first adsorption step;
a second adsorption step of adsorbing a second precursor serving as a reactant to the surfaces of the particles by supplying the second precursor to the other side of the inner reactor (2) along the feed line in a pulsed manner;
a second purge step of discharging a non-reacted portion of the second precursor to the outer reactor (1) outside the inner reactor (2) or from the deposition apparatus through the outer reactor (1) by supplying the purge gas to the other side of the inner reactor (2) in a pulsed manner after the second adsorption step; and
a surface reaction step of causing a surface reaction on the particles by increasing the temperature of at least one of the outer reactor (1) and the inner reactor (2).

8. The method of claim 7, wherein at least one of the first adsorption step and the second adsorption step is repeatedly performed at least a plurality of times.

9. The method of claim 7, wherein at least one of the first purge step and the second purge step is repeatedly performed at least a plurality of times.

10. The method of claim 7, wherein, in the first and second adsorption steps or the first and second purge steps, the particles are moved in the inner reactor (2) in response to the first and second precursors or the purge gas being supplied in a pulsed manner, so that the agglomerated particles are dispersed.

11. The method of claim 7, wherein the first adsorption step, the first purge step, the second adsorption step, and the second purge step are repeatedly performed at least once.

* * * * *